United States Patent
Uggmark

(12) 
(10) Patent No.: US 6,184,805 B1
(45) Date of Patent: Feb. 6, 2001

(54) APPARATUS AND A METHOD FOR KEYBOARD ENCODING

(75) Inventor: Johan G. M. Uggmark, Lund (SE)

(73) Assignee: Telefonaktiebolaget LM Ericsson (publ), Stockholm (SE)

( * ) Notice: Under 35 U.S.C. 154(b), the term of this patent shall be extended for 0 days.

(21) Appl. No.: 09/460,380

(22) Filed: Dec. 13, 1999

Related U.S. Application Data

(62) Division of application No. 08/993,242, filed on Dec. 18, 1997.

(30)    Foreign Application Priority Data

Dec. 19, 1996 (SE) .................................................... 9604684

(51) Int. Cl.$^7$ ................................................. H03M 11/00
(52) U.S. Cl. ................................ 341/29; 341/20; 341/22; 340/825.79
(58) Field of Search ................................ 341/29, 20, 22, 341/33, 86, 30; 379/368; 340/825.79

(56)    References Cited

U.S. PATENT DOCUMENTS

| | | | |
|---|---|---|---|
| 3,715,745 | 2/1973 | Arciprete | 341/86 |
| 3,778,815 | 12/1973 | Wright | 341/26 |
| 3,949,639 | 4/1976 | Adachi | 84/711 |
| 4,146,849 | 3/1979 | Satou | 331/111 |
| 4,315,108 | 2/1982 | Hoffman et al. | 379/361 |
| 4,327,255 | 4/1982 | Suszylo | 379/368 |
| 4,412,209 | 10/1983 | Frame et al. | 341/33 |
| 4,725,816 | 2/1988 | Petterson | 341/24 |
| 4,727,570 | 2/1988 | Tarbouriech | 379/361 |

FOREIGN PATENT DOCUMENTS

| | | |
|---|---|---|
| 1 402 162 | 8/1975 | (GB) . |
| 2 291762 | 1/1996 | (GB) . |

OTHER PUBLICATIONS

Analog Devices, "Low Cost Monolithic Voltage-to-Frequency Converter", AD654, Rev. A, One Technology Way, P.O. Box 9106, Norwood, MA 02062-9106.

*Primary Examiner*—Michael Horabik
*Assistant Examiner*—Albert K. Wong
(74) *Attorney, Agent, or Firm*—Burns, Doane, Swecker & Mahthis, L.L.P.

(57)    ABSTRACT

A device for use in an apparatus, preferably a radiotelephone, is equipped with a plurality of keys. Upon activation of a key, the device detects which key has been activated. The device includes a signal generating unit which generates an oscillating signal whose character corresponds to the activated key. A signal detecting unit determines, from the character of the oscillating signal, a digital value which indicates which key has been activated.

21 Claims, 5 Drawing Sheets

US 6,184,805 B1

APPARATUS AND A METHOD FOR KEYBOARD ENCODING

This application is a divisional, of application Ser. No. 08/993,242, filed Dec. 18, 1997 still pending.

FIELD OF INVENTION

The present invention relates to a keyboard encoding method and device for application in such apparatus as portable radiotelephones and calculators for instance. More specifically, the present invention relates to a device for detecting unambiguously which key of a number of keyboard keys or buttons has been actuated.

DESCRIPTION OF THE BACKGROUND ART

Such a keyboard encoding device is taught by U.S. Pat. No. 4,725,816. When a given key is actuated resistances are mutually coupled so as to generate, together with a current source, a d.c. voltage that is. unique to the actuated key. An A/D converter converts the unique d.c. voltage to a digital signal. One problem with this solution is that the A/D converter is a relatively expensive and complicated component. Another problem is that the A/D converter is difficult/ expensive td integrate in the same silicon chip as the remaining digital circuits.

A device that is very similar to the device described in U.S. Pat. No. 4,725,816 is designed to mutually couple resistances when a given key is actuated, such that said coupled resistances will form with a voltage source a voltage divider that delivers a unique d.c. voltage corresponding to the actuated key. An A/D converter converts the unique d.c. voltage to a digital signal. The above-mentioned problem encountered with the solution taught by U.S. Pat. No. 4,725,816 also applies to this solution. U.S. Pat. No. 4,327,255 teaches a signal generating device for a telephone keypad. Actuation of a key results in the generation of a signal that consists of two sinusoidal signals of different frequencies (Dual Tone Multi Frequency, DTMF). This known device, however, functions to generate a multi-frequency signal that corresponds to a given key and that is sent, for instance, to a telephone exchange for the purpose of identifying one of a number of numbers in a subscriber identity.

U.S. Pat. No. 4,315,108 teaches a DTMF signal generating device which is implemented in one single integrated circuit.

U.S. Pat. No. 3,949,639 teaches an electronic musical instrument provided with a keyboard. Actuation of a key generates a signal of given voltage which controls an oscillator to produce a tone of given frequency.

U.S. Pat. No. 4,412,209 describes a device which in response to activation of one of a number of switches produces a unique combination of resistances and capacitances that can be detected by an external circuit connected to the device and therewith determine which key has been actuated.

SUMMARY OF THE INVENTION

In respect of an apparatus that is equipped with a number of keys, the present invention addresses the problem of detecting which of the keys has been actuated in response to actuation of said key.

Accordingly, one object of the present invention is to provide a solution to the problem of detecting unambiguously which key of said number of keys has been actuated, with the aid of inexpensive electronic circuits to this end.

The aforesaid problem is solved generally by the invention with the aid of a method and a device in which one or more oscillating signals is/are generated in response to actuation of one of the keys, and the identity of the actuated key is is determined from these signals.

More specifically, the invention solves the aforesaid problem by generating in response to the actuation of a given key at least one oscillating signal whose character corresponds unambiguously with the actuated key.

According to one embodiment of the invention, it is the frequency of the oscillating signal that corresponds unambiguously to the actuated key.

According to another embodiment of the invention, it is the pulse ratio (relative pulse duration) of the oscillating signal that corresponds unambiguously to the actuated key.

According to a further embodiment of the invention, there are generated two oscillating signals whose frequency difference corresponds unambiguously to the actuated key.

In all embodiments of the invention, there is determined from the signals generated a value which indicates unambiguously the key that has been actuated.

One advantage of the invention is that it can be implemented with the aid of simpler and less expensive circuits, or circuit units, than was possible with earlier known devices of this kind.

Another advantage is that certain embodiments of the invention provide improved protection against erroneous detection arising from variations in the temperature or humidity of the apparatus surroundings, for instance.

The invention will now be described in more detail with reference to preferred embodiments thereof and also with reference to the accompanying drawings.

DESCRIPTION OF PREFERRED EMBODIMENTS

Many different types of apparatus are equipped with a keyboard or keypad through which information can be entered into the apparatus concerned. Examples of such apparatus include portable radiotelephones, calculators, digital code locks (for safes, vaults, etc.) and so on. The term portable radiotelephone shall be understood to include all portable radio equipment adapted for radio communications, such as mobile telephones, pagers, communicators (i.e. so-called organisers with a built-in telephone), tele-facsimile machines and printers. The aforesaid equipment can be used in some type of radio network, such as cellular networks, satellite networks or radio-LAN, for instance.

Figure 1:
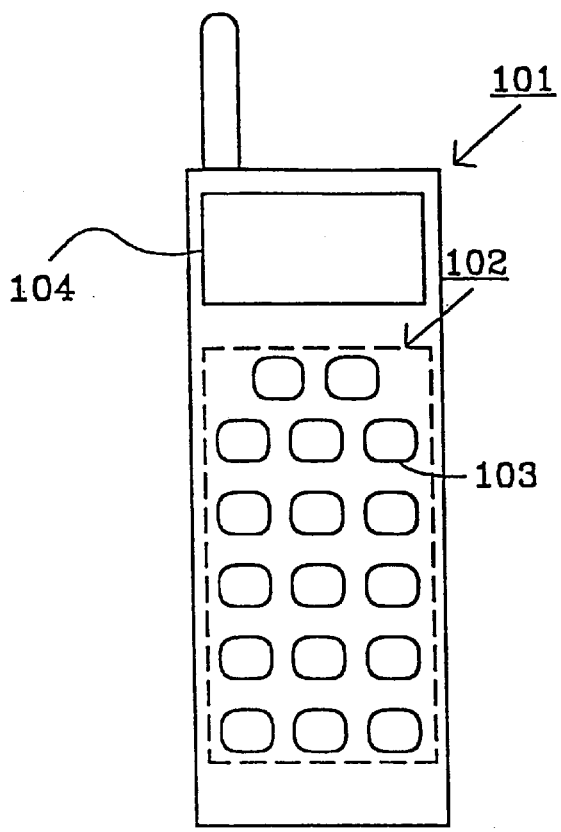
FIG. 1 is a front view of a mobile telephone.

FIG. 1 is a front view of a mobile telephone 101. The telephone 101 includes a keypad 102 that contains a number of keys 103 with which information can be entered into the telephone 101, for instance such information as PIN-code, intended subscriber number, and so on. The mobile telephone 101 must necessarily include a keypad encoder which when one of the keys 103 is actuated is able to determine the identity of the actuated key and to deliver a value that indicates unambiguously which of the keys 103 has been actuated. Because the circuits that process the information entered into the mobile telephone 101 are digital circuits, the aforesaid value must also be digital. The entered information, e.g. some form of subscriber number, corresponding to the actuated keys 103 is displayed on a display 104 which enables the user to correct possible errors in the information entered.

The encoding device installed in the telephone 101 may be implemented in different ways.

Figure 2:
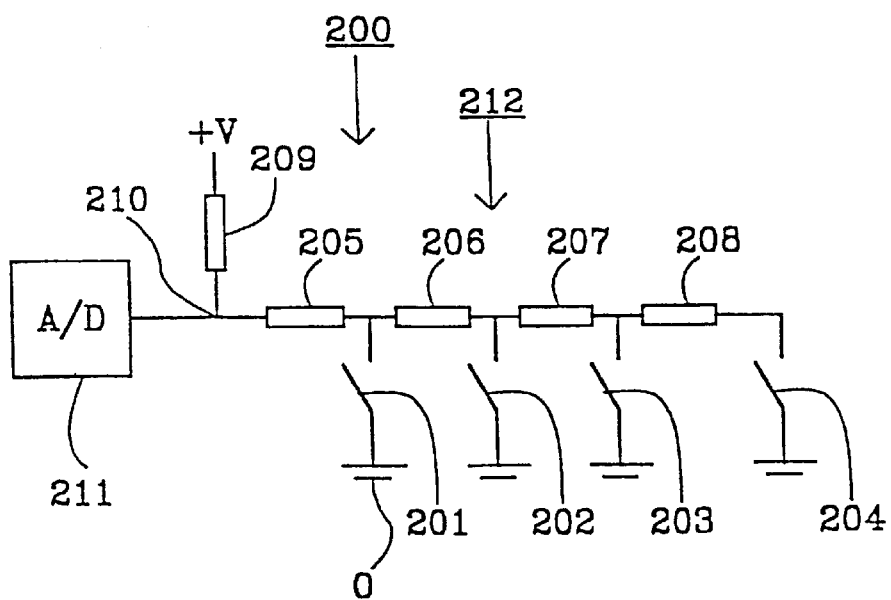
FIG. 2 is a block schematic of a device for encoding a keyboard in accordance with known practice.

FIG. 2 illustrates an example of a known encoding device 200. Each of the keys 103 in FIG. 1 coacts with a corresponding switch 201–204. The encoding device also includes a number of series-connected resistances 205–208 which together form a resistance ladder 212 having a first connection point 210 upstream of the first resistance 205 in the resistance ladder 212. First side of each of the switches 201–204 is connected to ground, or earth, and its second side is connected downstream of the corresponding resistance 205–208 in the resistance ladder 212, i.e. the first switch 201 is connected downstream of the first resistance 205, and so on. The aforesaid first connection point 210 is connected to a positive fixed potential +V via a further resistance 209. The input of an analogue-digital converter 211 is also connected to the connection point 210. When one of the keys 103 is actuated, the switch 203 that corresponds to this key is closed and a voltage divider is formed by the additional resistance 209 together with those resistances 205–207 in the resistance ladder 212 that are connected upstream of the closed switch 203. The voltage generated between the connection point 210 and earth 0 corresponds unambiguously to the actuated key 103. The analogue-digital converter 211 reads this voltage and delivers a digital value which indicates which of the keys 103 has been actuated. One drawback with this solution is that the analogue-digital converter 211 is a relatively expensive and complicated component. It is also difficult/expensive to integrate the analogue-digital converter 211 in the same silicon chip as the remaining digital circuits in the apparatus 103, since it is not possible to use a digital CMOS process in this case, but that a more expensive analogue CMOS process is required.

Keyboard encoding in accordance with the present invention is based on generating one or more oscillating electric signals from which there can be subsequently derived a value that corresponds unambiguously to an actuated key. Devices that generate and detect oscillating signals can be constructed simply and inexpensively. For instance, those active components required in such circuits can be implemented fully in a chip provided with a purely digital CMOS process, therewith obviating the need to use the more expensive analogue CMOS or BiCMOS process.

Figure 3:
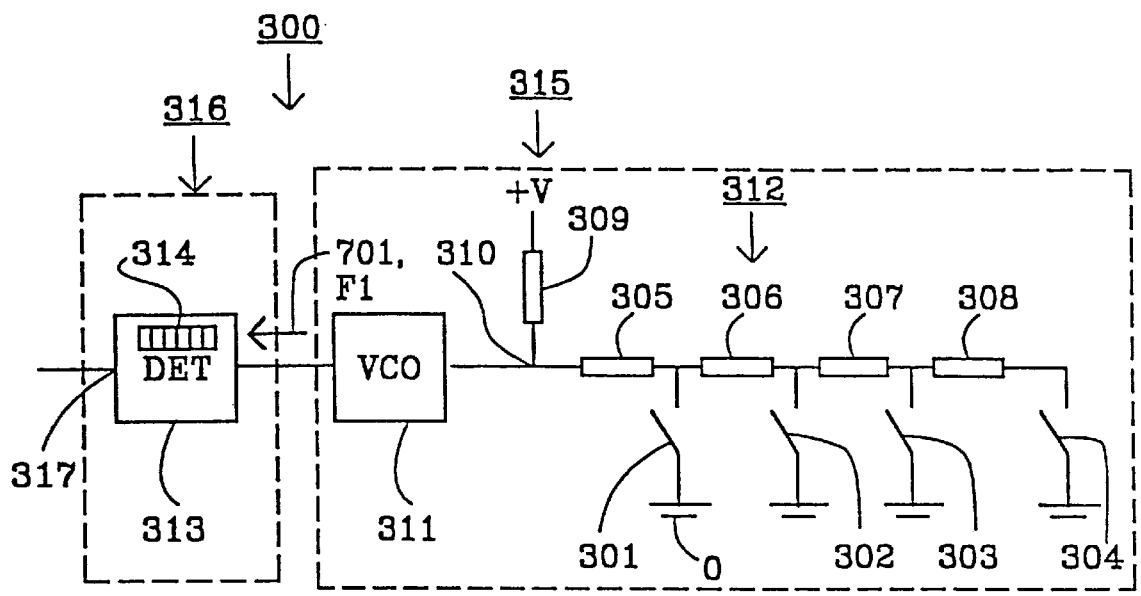
FIG. 3 is a block schematic of a keyboard of an inventive keyboard encoding device in which there is generated an oscillating signal that has a unique frequency which corresponds to the actuated key.

FIG. 3 illustrates one embodiment of an inventive keyboard encoding device 300. Each of the keys 103 of FIG. 1 coacts with a corresponding switch 301–304. The encoding device 300 also includes a number of series-connected resistances 305–308 which together form a resistance ladder 312 that has a first connection point 310 upstream of the first resistance 305 in the resistance ladder 312. First side of each of the switches 301–304 is connected to earth 0 and its second side is connected downstream of the corresponding resistance 305–308 in the resistance ladder 212, i.e. the first switch 301 is connected downstream of the first resistance 305, and so on. The aforesaid first connection point 310 is connected to a positive, fixed potential +V via an additional resistance 309. The aforedescribed part of the encoding device 300 finds direct correspondence in the known encoding device 200 shown in FIG. 2. However, distinct from the known encoding device 200 shown in FIG. 2, the inventive encoding device 300 of the illustrated embodiment includes a voltage controlled oscillator (VCO) 311, whose control input is connected to said first connection point 310. A frequency detector 313 is connected to the output of the oscillator 311. The voltage occurring between the connection point 310 and earth upon key actuation controls the oscillator 311 to deliver an oscillating signal 701 that has a frequency F1 which corresponds unambiguously to the actuated key 103. The frequency detector 313 determines the frequency F1 of the signal 701 generated by the oscillator 311 in a known manner, and forms in a register a digital value 314 that corresponds unambiguously to the actuated key 103. The detector has an output 317 over which the digital value 314 can be read by other digital circuits in the apparatus 101.

Figure 7A:
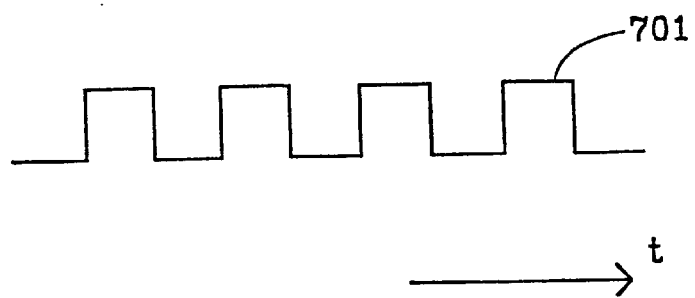
FIGS. 7A–C are time diagrams relating to oscillating signals.

FIG. 7A is a time diagram relating to the generated oscillating signal 701, in which time is denoted with t. The frequency of the generated oscillating signal 701 depends on which key is actuated and corresponds unambiguously to the actuated key. The generated oscillating signal 701 is shown in FIG. 7A as a square wave, although other wave forms are conceivable, such as sine waves, triangular waves, etc.

The voltage controlled oscillator 311 of the FIG. 3 embodiment may be constructed as described in U.S. Pat. No. 4,146,849, for instance. When deciding on the choice of oscillator, it will be observed that the oscillator 311 does not need to exhibit extremely high linearity between input signal and output signal. The only requirement placed on the oscillator 311 in this respect is that the frequency detector 313 will be able to determine from the frequency F1 of the generated oscillating signal 701 which of the keys 103 has been actuated, irrespective of which key it is. This property should be influential in choosing a type of oscillator that has an appropriate degree of linearity between input signal and output signal, so as to refrain from the use of an unnecessarily expensive and unnecessarily complicated oscillator 311.

The encoding device 300 of the FIG. 3 embodiment can be said to consist of a signal detecting unit 316 that includes the frequency detector 313 and of a signal generating unit 315 that includes the remaining components of the encoding device 300.

The signal generating unit 315 is adapted to generate the oscillating signal 701 whose character, in this case the signal frequency F1, unambiguously corresponds to the actuated key 103. The resistance ladder 312 in combination with the switches 301–304 connected thereto can be considered to form a network. When one of the switches 301–304 is activated in response to actuation of its corresponding key 103, a resistance is created between the first connection point 310 and earth 0. This created resistance will correspond unambiguously to the actuated key 103 and will determine the character F1 of the generated oscillating signal 701, such that said character, in turn, unambiguously corresponds to the actuated key 103. The signal detecting unit 316 is adapted to determine on the basis of the generated oscillating signal 701 the digital value 314 that unambiguously indicates which of the keys 103 has been actuated.

Figure 4:
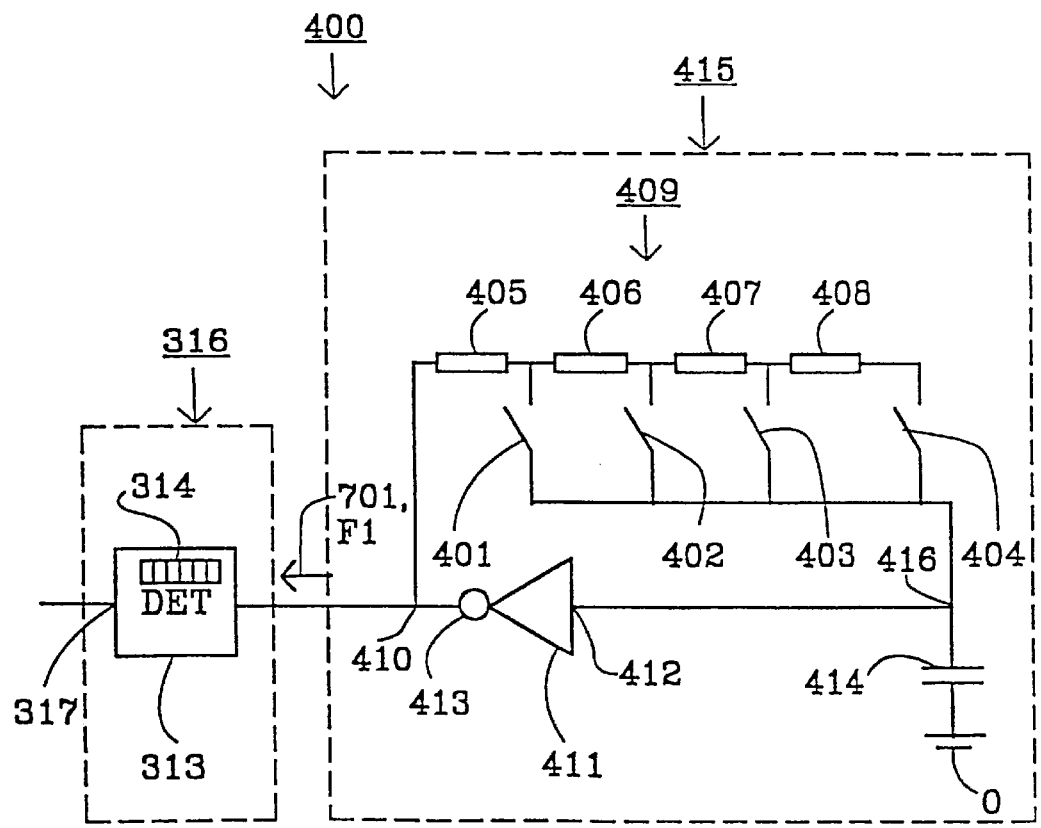
FIG. 4 is a block schematic of an inventive device that includes a signal generating unit constructed around an inverter.

FIG. 4 illustrates another embodiment of an inventive encoding device. The Figure shows an encoding device 400 which includes a signal generating unit 415. The signal generating unit 415 includes a resistance ladder 409 comprising series-connected resistances 405–408 and a first connection point 410 upstream of the first resistance 405.

The signal generating unit 415 also includes switches 401–404 which coact with respective keys 103 and second side of each of which is connected downstream of the corresponding resistance 405–408 in the resistance ladder 409. Up to this point, the signal generating unit 415 finds direct correspondence with the signal generating unit 315 of the FIG. 3 embodiment. The signal generating unit 415 of the FIG. 4 embodiment includes a Schmitt trigger inverter 411 having an output 412 and an output 413. Such an inverter 411 can be found in National Semiconductors circuit MM74C14, for instance. Respective first sides of the switches 405–408 are mutually connected at a common point 416, to which the input 412 of the inverter 411 is also connected. A capacitance 414 is connected between the common connection point 416 and earth 0. The aforesaid first connection point 410 of the resistance ladder 409 is connected to the output 413 of the inverter 411. When one of the keys 103 is actuated, the switch 401–404 corresponding to this key is closed and the signal generating unit 415 generates an oscillating signal 701 on the output 413 of the inverter 411. The signal is a square wave signal having a frequency F1 that corresponds unambiguously to the actuated key 103 (see FIG. 7A). A signal detecting unit is connected to the inverter output 413. As with the FIG. 3 embodiment, the frequency F1 of the generated signal 701 is controlled by a resistance.that is created in a network which includes the resistance ladder 409 and the switches 401–404 connected thereto. In this case, the resistance that unambiguously corresponds to the actuated key 103 is created between the first connection point 410 and the common connection point 416. The same signal detecting unit 316 used in the FIG. 3 embodiment can also be used in the FIG. 4 embodiment. As described earlier with reference to FIG. 3, the frequency detector 313 determines the frequency F1 of the generated oscillating signal 701 and forms the digital value 314 that indicates which of the keys 103 has been actuated. The inverter 411 and the frequency detector 313 may advantageously be integrated together with other digital circuits in the mobile telephone in a chip produced with a purely digital CMOS process.

A circuit that generates an oscillating electric signal on the basis of one or more inverters and a few impedance elements, preferably resistances and capacitances, can be implemented in many different ways (see, for instance, Fletcher, William I., "Engineering Approach to Digital Design", Prentice/Hall 1980, pp. 298–300). By constructing one of these impedance elements so that its impedance will vary stepwise in dependence on which of the keys 103 is actuated, there can be constructed a signal generating unit of the kind included in the FIG. 4 embodiment, for instance.

Figure 5:
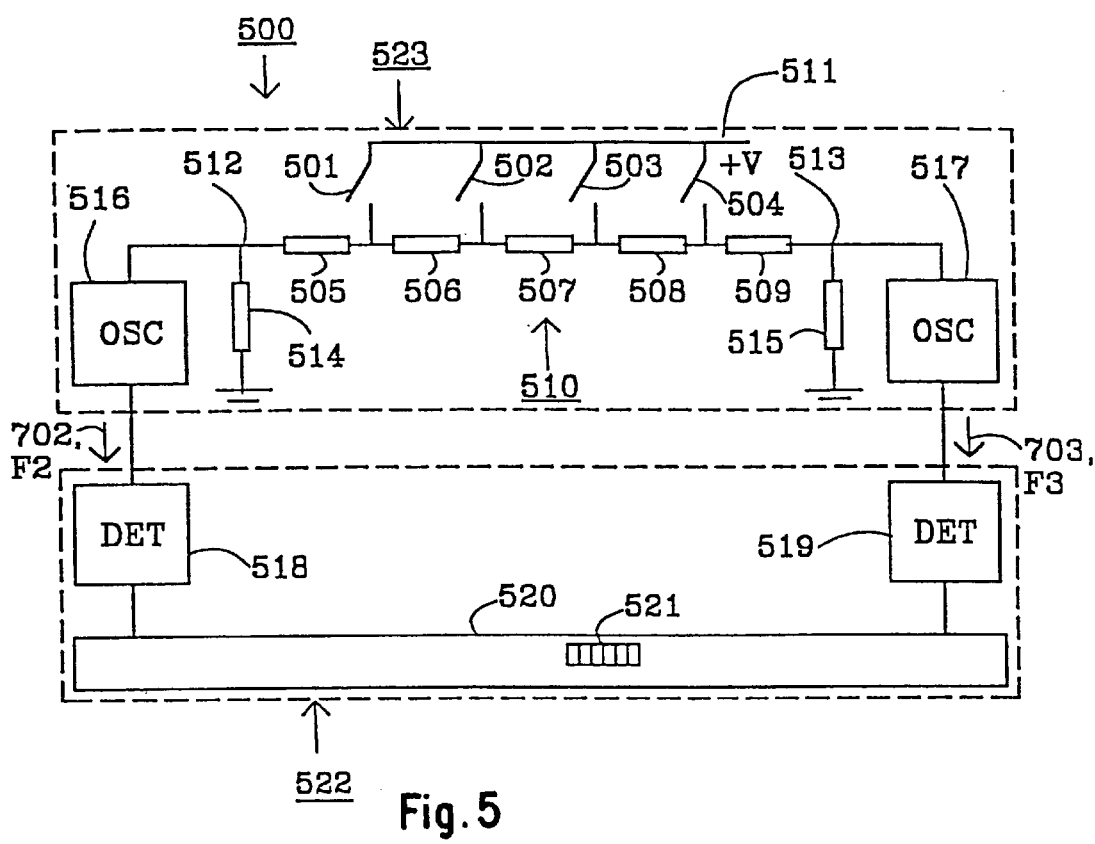
FIG. 5 is a block schematic of an inventive keyboard encoding device in which there are generated two oscillating signals that have a unique frequency difference which corresponds to an actuated key.

FIG. 5 illustrates another embodiment of an inventive encoding device, here referenced 500. This embodiment also includes a number of resistances 505–509 which are connected in series so as to form a resistance ladder 510. First sides of respective switches 501–504 connected to respective keys 103 in FIG. 1 are connected to a common point 511 connected to a positive, fixed potential +V. The second side of each of said switches 501–504 is connected in the resistance ladder 510 such that one of the switches 501–505 is connected between two mutually sequential resistances 505–509 in the resistance ladder 510. The resistance ladder 510 has a first connection point 512 upstream of the first resistance 505 in said ladder, and a second connection point 513 downstream of the last resistance 509 in said ladder. The first connection point 512 is connected to earth via a first additional resistance 514. Correspondingly, the second connection point 513 is connected to earth via a second additional resistance 515. The first connection point 512 is also connected to a first voltage controlled oscillator 516 and, correspondingly, the second connection point 513 is connected to a second voltage controlled oscillator 517 and each of the oscillators is connected to a respective first and second frequency detector 518 and 519. Each of the frequency detectors 518–519 is connected to a respective input of a microprocessor 520.

Upon actuation of one of the keys 103, the switch 503 corresponding to this key is closed and two voltage dividers are formed therewith. The one voltage divider is comprised of those resistances 505–507 in the resistance ladder 510 that are connected upstream of the switch 503, together with the first additional resistance 514. The second voltage divider is comprised of those resistances 508–509 in the resistance ladder 510 that are connected downstream of the switch 503 together with the second additional resistance 515. The first oscillator 516 is controlled by the voltage that occurs between the first connection point 512 and earth and generates a first oscillating signal 702 whose frequency F2 corresponds to the aforesaid voltage. Correspondingly, the second oscillator 517 is controlled by the voltage occurring between the second connection point 513 and earth to generate a second oscillating signal 703 whose frequency F3 corresponds to this latter voltage.

The frequency detectors 518–519 connected to the oscillators 516–517 determine the frequency F2–F3 of respective signals 702–703 and build a first and a second digital value corresponding to these frequencies. The microprocessor 520 reads these two digital values and calculates a third digital value 521 that constitutes the difference between said two values. The third digital value 521 corresponds to this frequency difference and unambiguously indicates which of the keys 103 has been actuated.

Figure 7B:
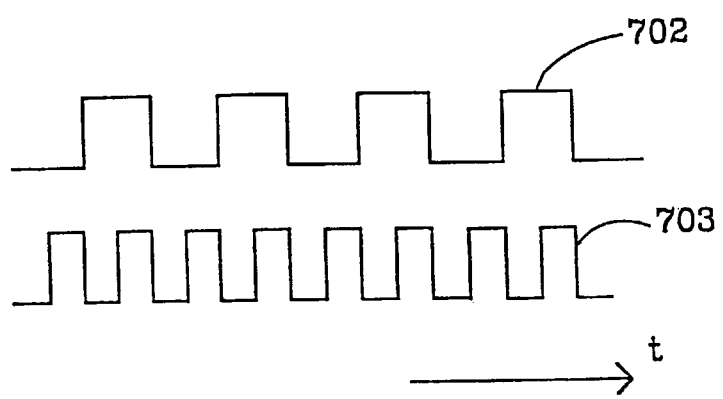

FIG. 7B is a time diagram relating to the generated oscillating signals 702–703, where time is denoted with t. Naturally, the generated oscillating signals 702–703 may have wave shapes other than the square wave shapes illustrated in FIG. 7B. The encoding device 500 of the FIG. 5 embodiment can also be considered to consist of a signal detecting unit 522 which, in the illustrated case, includes the frequency detector 518–519 and the microprocessor 520, and also of a signal generating unit 523 which includes the remaining components of the encoding device 500. The signal generating unit 523 is adapted to generate the two oscillating signals 702–703, where the characters of the signals in combination with the difference between the frequencies F2–F3 of the two signals 702–703 unambiguously indicates the actuated key 103. Similar to the reasoning dedicated to FIGS. 3 and 4, the resistance ladder 510 and the switches 501–504 connected thereto can be considered to form a network. Activation of one of the switches 501–504 in response to actuation of one of the corresponding keys 103 creates a resistance between the common point 511 and the first connection point 512 and a further resistance between the common point 511 and the second connection point 512. These created resistances determine the frequencies of each of the two oscillating signals 702, 703, such that the frequency difference between the two signals will unambiguously correspond to the actuated key 103. As mentioned earlier, the signal detecting unit 522 of this embodiment is adapted to determine on the basis of the generated oscillating signals 702–703 the digital value 521 that unambiguously indicates which of the keys 103 has been actuated.

One advantage afforded by the FIG. 5 embodiment is that the encoding device 500 provides better protection against erroneous detection when the mobile telephone 101 is subjected to variations in ambient temperature, for instance. These temperature variations may cause the frequencies F2–F3 of the generated signals 702–703 that correspond to actuation of a given key 103 drift slightly. Both oscillators 516–517 will drift essentially to the same extent, and consequently the frequency difference between the two signals 702–703 will remain the same and the risk of erroneous detection due to said temperature variations is thus eliminated.

Figure 6:
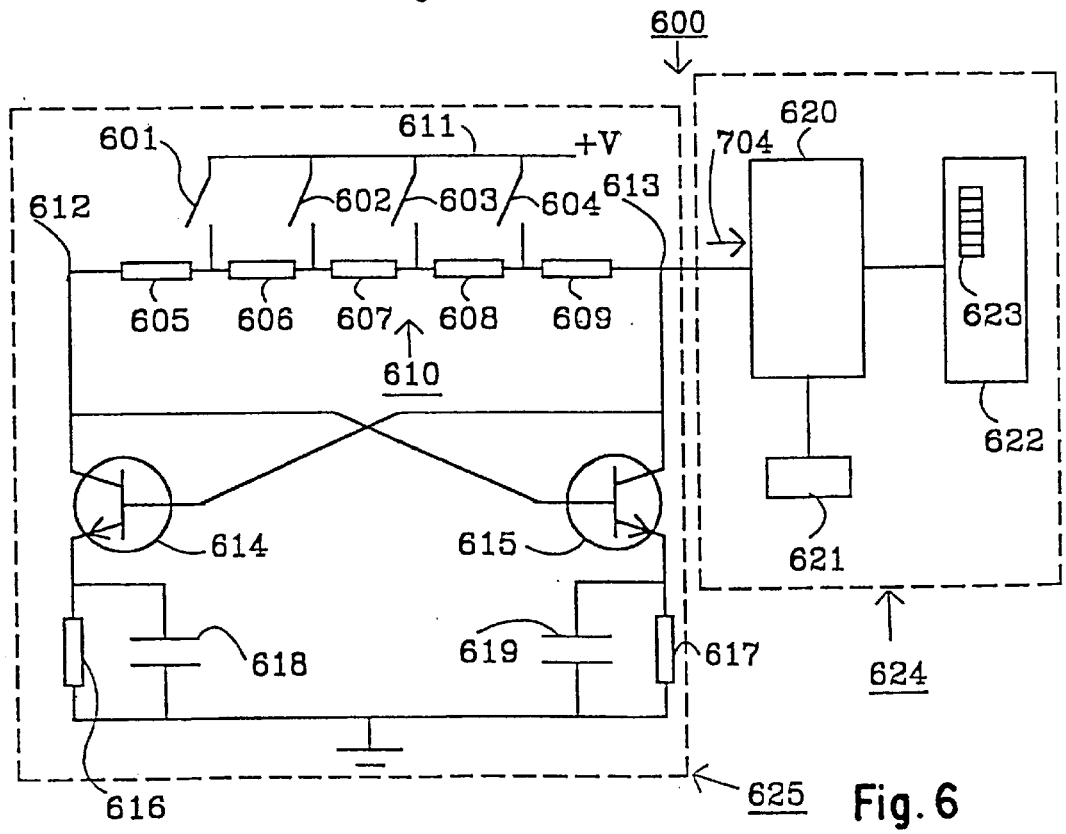
FIG. 6 is a block schematic of an inventive keyboard encoding device in which there is generated an oscillating signal that has a relative pulse duration that corresponds unambiguously to an actuated key.

FIG. 6 illustrates a fourth embodiment of an inventive encoding device. The encoding device 600 includes a resistance ladder comprising a number of series-connected resistances 605–609 with a first connection point 612 upstream of the first resistance 605, and a second connection point 613 downstream of the last resistance 609. The first sides of respective switches 601–604 corresponding to respective keys 103 in FIG. 1 are mutually connected at a common point 611 connected to a positive, fixed potential +V. The second sides of respective switches 601–604 are connected in the resistance ladder 610 such that one of the switches 601–604 is connected between two mutually sequential resistances 605–609 in the resistance ladder 610. The encoding device 600 finds immediate correspondence with the encoding device 500 of the FIG. 5 embodiment up to this point. In the case of the FIG. 6 embodiment, however, the resistance ladder 610 is connected to an astable flip-flop of known kind. The first resistance-ladder connection point 612 is connected to the collector of a first transistor 614 and to the base of a second transistor 615. The second connection point 613 is connected to the collector of the second transistor 615 and to the base of the first transistor 614. The emitter of the first transistor 615 is connected to earth via a first emitter resistance 616 parallel coupled with a first capacitance 618. Correspondingly, the emitter of the second transistor 615 is connected to earth via a second emitter resistance 617 parallel connected with a second capacitance 619. When one of the keys 103 is actuated, the switch corresponding to this key will also be actuated and the aforedescribed circuit commence to oscillate. When the oscillation is studied, i.e. the generated oscillating signal 704, in the second connection point 613, it will be noticed that the oscillation frequency is constant irrespective of which key 103 has been actuated. This is because the sum of the collector resistances is always the same. On the other hand, the relative pulse duration (duty cycle) will vary, since the two transistors 614–615 will obtain different collector resistances that depend on which of the keys 103 was actuated, and consequently take different lengths of time to charge the capacitor 618–619.

Figure 7C:
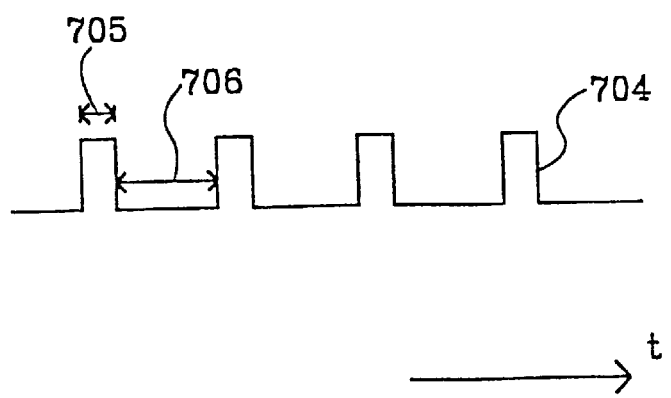

FIG. 7C is a time diagram relating to the generated oscillated signal 704, where time is given as t. The relative pulse duration, or duty cycle, is comprised of the ratio of the pulse duration 705 to the space interval 706 between the pulses. The relative pulse duration of the generated oscillating signal 704 will depend on which of the keys has been actuated, and corresponds unambiguously to this actuated key.

A detector 620 is connected to the second connection point 613 in FIG. 6. The detector 620 determines the time over which the second connection point 613 is high (i.e. the pulse duration 705 in FIG. 7C), and also the time over which the second connection point is low (i.e. the pulse space interval 706 in FIG. 7C). This is effected by the detector 620 counting pulses delivered by a clock circuit 621 which is connected to the detector 620 and which delivers the aforesaid pulses at a specific fixed frequency. The detector 620 determines a first digital value corresponding to the number of pulses when the connection point 613 is high, and a second digital value corresponding to the number of pulses when the connection point 613 is low. Connected to the detector 620 is a microprocessor 622 which reads the aforesaid values and creates on the basis thereof a third digital value 623 that corresponds to the relative pulse duration, or duty cycle, and thus indicates unambiguously which of the keys 103 has been actuated. The encoding device 600 of the FIG. 6 embodiment can be considered as being comprised of a signal generating unit 624 and a signal detecting unit 624.

The resistances included in the resistance ladders illustrated in FIGS. 3–6 may be comprised of discrete resistors or may be printed directly on a printed circuit board in a known manner. In this latter case, a string of conductive material, such as polymer-film (PTF) for instance is applied to the printed circuit board. The aforementioned switches are connected along this string. In this case, the resistances illustrated in FIGS. 3–6 will thus correspond to a part of the string.

Figure 8A:
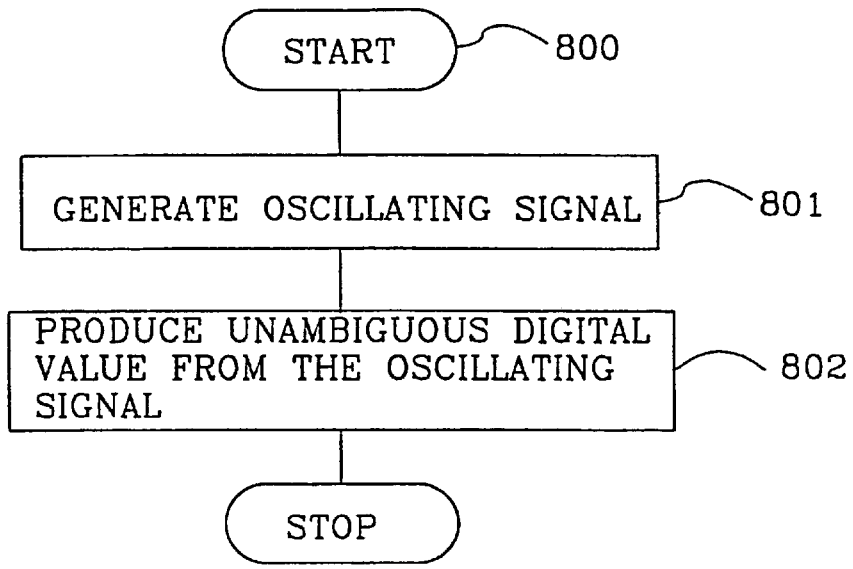
FIGS. 8A–B are flowsheets which respectively illustrate two methods according to the invention.

FIG. 8A is a flowchart illustrating an inventive method for detecting which of the keys 103 has been actuated, in response to actuation of said keys. Step 800, "START" denotes that one of the keys has been actuated (depressed). In step 801, there is generated an oscillating electric signal whose character, for instance frequency or relative pulse duration, unambiguously corresponds to the actuated key 103. In step 802, there is created from this oscillating signal a digital value which unambiguously indicates which of the keys 103 has been actuated.

Figure 8B:
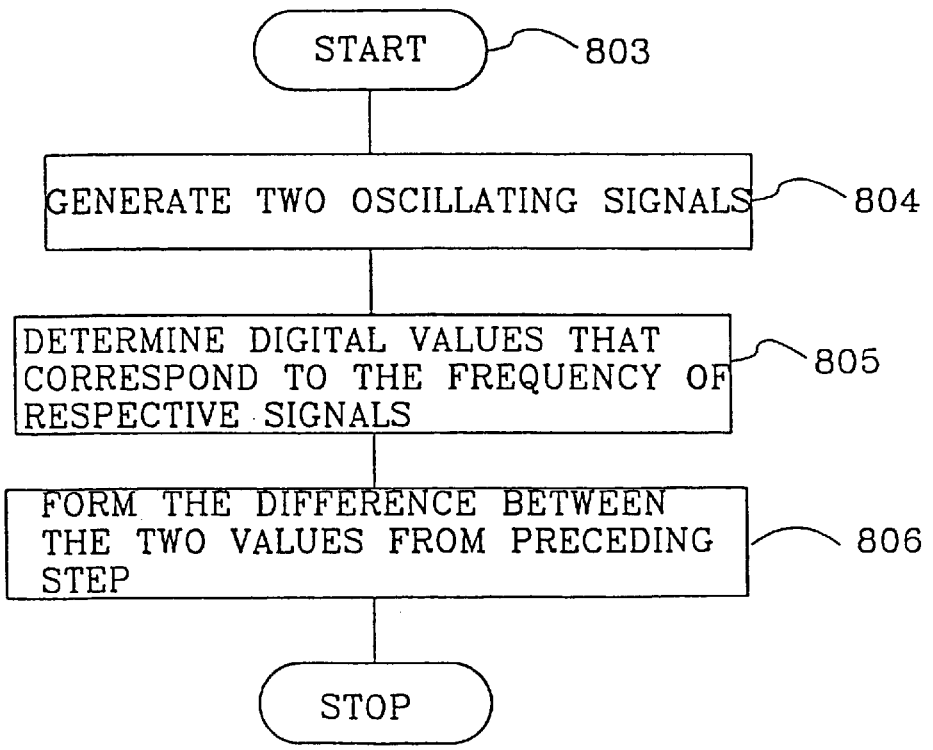

FIG. 8B is another flowchart that illustrates an inventive method of detecting which of the keys 103 has been actuated in response to actuation of one of said keys. Step 803, "START" denotes that one of the keys has been actuated (depressed). In step 804, there is generated two oscillating electric signals having a difference in frequency that unambiguously corresponds to the actuated key 103. In step 805, there is determined the frequencies of the two signals, and the digital values corresponding to respective signal frequencies are formed. In step 806, there is determined a third digital value as the difference between the values determined in step 805. This third digital value corresponds to the frequency difference and unambiguously indicates which of the keys 103 has been actuated.

What is claimed is:

1. An encoding device, for detecting an actuated key of a plurality of keys, the encoding device comprising:
   a signal generating unit that generates an oscillating signal having a character which corresponds to the actuated key;
   a signal detecting unit connected to the signal generating unit, said signal detecting unit determines, from the character of the oscillating signal, a final digital value that indicates the actuated key;

wherein the signal generating unit comprises a resistance ladder having a plurality of series-connected resistances and having a first connection point upstream of the first resistance in said resistance ladder and having a second connection point downstream of the last resistance in said resistance ladder;

wherein the signal generating unit further comprises switches, each switch corresponding to a respective key of said plurality of keys and each switch having a first and a second connection point between which electrical conduction occurs upon actuation of the respective key;

wherein the first connection point of each switch is connected to a common point that is common to all said switches and the second connection point of each switch is connected in the resistance ladder such that between two of the resistances in the resistance ladder no more than one of the switches will be connected;

wherein the actuated key activates a corresponding switch that creates a first resistance and a second resistance between said common point and said first and second connection point of the resistance ladder, respectively; and wherein the character, of the oscillating signal, has a pulse duration controlled by the first resistance between said common point and said first connection point of the resistance ladder and a pulse space interval controlled by the second resistance between said common point and said second connection point of the resistance ladder, wherein said pulse duration and pulse space correspond to the actuated key.

2. The encoding device of claim 1 wherein said signal generating unit further comprises:
an astable flip-flop.

3. The encoding device of claim 2 wherein said astable flip-flop further comprises:
a first and second transistor, each having a base, a collector, and an emitter;
said first transistor collector and said second transistor base connected to said first connection point of the resistance ladder;
said second transistor collector and said first transistor base connected to said second connection point of the resistance ladder;
said first and second transistor emitters each being connected to ground through a corresponding resistance and capacitance connected in parallel; and
wherein said common point is connected to a voltage source.

4. The encoding device of claim 1 wherein said signal detecting unit further comprises:
a detector connected to said second connection point of the resistance ladder, a clock circuit, and a processor;
wherein said detector creates a first digital value by counting pulses from said clock circuit during said pulse duration;
wherein said detector creates a second digital value by counting pulses from said clock circuit during said pulse space interval; and
wherein said processor creates said final digital value, that indicates the actuated key, from said first and second digital values.

5. An apparatus, preferably a portable radiotelephone, comprising:
a plurality of keys and an encoding device that detects an actuated key of said plurality of keys, wherein the encoding device comprises:
a signal generating unit that generates an oscillating signal having a character corresponding to an actuated key;
a signal detecting unit connected to said signal generating unit, wherein said signal detecting unit determines, from the character of the oscillating signal, a final digital value indicating the actuated key;

wherein the signal generating unit comprises a resistance ladder having a plurality of series-connected resistances and having a first connection point upstream of the first resistance in said resistance ladder and having a second connection point downstream of the last resistance in said resistance ladder;

wherein the signal generating unit further comprises switches, each switch corresponding to a respective key of said plurality of keys and each switch having a first and a second connection point between which electrical conduction occurs upon actuation of the respective key;

wherein the first connection point of each switch is connected to a common point that is common to all said switches and the second connection point of each switch is connected in the resistance ladder such that between two of the resistances in the resistance ladder no more than one of the switches will be connected;

wherein the actuated key activates a corresponding switch that creates a first resistance and a second resistance between said common point and said first and second connection point of the resistance ladder, respectively; and wherein the character, of the oscillating signal, has a pulse duration controlled by the first resistance between said common point and said first connection point of the resistance ladder and a pulse space interval controlled by the second resistance between said common point and said second connection point of the resistance ladder, wherein said pulse duration and pulse space correspond to the actuated key.

6. The apparatus of claim 5 wherein said signal generating unit further comprises:
an astable flip-flop.

7. The apparatus of claim 6 wherein said astable flip-flop further comprises:
a first and second transistor, each having a base, a collector, and an emitter;
said first transistor collector and said second transistor base connected to said first connection point of the resistance ladder;
said second transistor collector and said first transistor base connected to said second connection point of the resistance ladder;
said first and second transistor emitters each being connected to ground through a corresponding resistance and capacitance connected in parallel; and
wherein said common point is connected to a voltage source.

8. The apparatus of claim 5 wherein said signal detecting unit further comprises:
a detector connected to said second connection point of the resistance ladder, a clock circuit, and a processor;
wherein said detector creates a first digital value by counting pulses from said clock circuit during said pulse duration;

wherein said detector creates a second digital value by counting pulses from said clock circuit during said pulse space interval; and wherein said processor creates said final digital value, that indicates the actuated key, from said first and second digital values.

9. An encoding device, for detecting an actuated key of a plurality of keys, the encoding device comprising:

a signal generating unit that generates an oscillating signal having a character which corresponds to the actuated key;

a signal detecting unit connected to the signal generating unit, said signal detecting unit determines, from the character of the oscillating signal, a final digital value that indicates the actuated key;

wherein the signal generating unit comprises a resistance ladder having a plurality of series-connected resistances and having a first connection point upstream of the first resistance in said resistance ladder and having a second connection point downstream of the last resistance in said resistance ladder;

wherein the signal generating unit further comprises switches, each switch corresponding to a respective key of said plurality of keys and each switch having a first and a second connection point between which electrical conduction occurs upon actuation of the respective key;

wherein the first connection point of each switch is connected to a common point; and wherein the actuated key activates a corresponding switch that creates a first resistance and a second resistance between said common point and said first and second connection point of the resistance ladder, respectively.

10. The encoding device of claim 9 wherein said signal generating unit further comprises the second connection point of each switch is connected in the resistance ladder such that between two of the resistances in the resistance ladder no more than one of the switches will be connected.

11. The encoding device of claim 10 wherein said signal generating unit further comprises wherein the character, of the oscillating signal, has a pulse duration controlled by the first resistance between said common point and said first connection point of the resistance ladder and a pulse space interval controlled by the second resistance between said common point and said second connection point of the resistance ladder, wherein said pulse duration and pulse space correspond to the actuated key.

12. The encoding device of claim 9 wherein said signal generating unit further comprises:

an astable flip-flop.

13. The encoding device of claim 12 wherein said astable flip-flop further comprises:

a first and second transistor, each having a base, a collector, and an emitter;

said first transistor collector and said second transistor base connected to said first connection point of the resistance ladder;

said second transistor collector and said first transistor base connected to said second connection point of the resistance ladder;

said first and second transistor emitters each being connected to ground through a corresponding resistance and capacitance connected in parallel; and wherein said common point is connected to a voltage source.

14. The encoding device of claim 11 wherein said signal detecting unit further comprises:

a detector connected to said second connection point of the resistance ladder, a clock circuit, and a processor;

wherein said detector creates a first digital value by counting pulses from said clock circuit during said pulse duration;

wherein said detector creates a second digital value by counting pulses from said clock circuit during said pulse space interval; and wherein said processor creates said final digital value, that indicates the actuated key, from said first and second digital values.

15. An apparatus comprising:

a plurality of keys and an encoding device that detects an actuated key of said plurality of keys, wherein the encoding device comprises:

a signal generating unit that generates an oscillating signal having a character which corresponds to the actuated key;

a signal detecting unit connected to the signal generating unit, said signal detecting unit determines, from the character of the oscillating signal, a final digital value that indicates the actuated key;

wherein the signal generating unit comprises a resistance ladder having a plurality of series-connected resistances and having a first connection point upstream of the first resistance in said resistance ladder and having a second connection point downstream of the last resistance in said resistance ladder;

wherein the signal generating unit further comprises switches, each switch corresponding to a respective key of said plurality of keys and each switch having a first and a second connection point between which electrical conduction occurs upon actuation of the respective key;

wherein the first connection point of each switch is connected to a common point; and wherein the actuated key activates a corresponding switch that creates a first resistance and a second resistance between said common point and said first and second connection point of the resistance ladder, respectively.

16. The apparatus of claim 15 wherein said apparatus is a portable radiotelephone.

17. The encoding device of claim 15 wherein said signal generating unit further comprises the second connection point of each switch is connected in the resistance ladder such that between two of the resistances in the resistance ladder no more than one of the switches will be connected.

18. The encoding device of claim 17 wherein said signal generating unit further comprises wherein the character, of the oscillating signal, has a pulse duration controlled by the first resistance between said common point and said first connection point of the resistance ladder and a pulse space interval controlled by the second resistance between said common point and said second connection point of the resistance ladder, wherein said pulse duration and pulse space correspond to the actuated key.

19. The apparatus of claim 15 wherein said signal generating unit further comprises:

an astable flip-flop.

20. The apparatus of claim 19 wherein said astable flip-flop further comprises:

a first and second transistor, each having a base, a collector, and an emitter;

said first transistor collector and said second transistor base connected to said first connection point of the resistance ladder;

said second transistor collector and said first transistor base connected to said second connection point of the resistance ladder;

said first and second transistor emitters each being connected to ground through a corresponding resistance and capacitance connected in parallel; and wherein said common point is connected to a voltage source.

21. The apparatus of claim 20 wherein said signal detecting unit further comprises:

a detector connected to said second connection point of the resistance ladder, a clock circuit, and a processor;

wherein said detector creates a first digital value by counting pulses from said clock circuit during said pulse duration;

wherein said detector creates a second digital value by counting pulses from said clock circuit during said pulse space interval; and wherein said processor creates said final digital value, that indicates the actuated key, from said first and second digital values.

* * * * *